US011004992B2

(12) United States Patent
Busse et al.

(10) Patent No.: US 11,004,992 B2
(45) Date of Patent: May 11, 2021

(54) REAR FACE ELEMENT FOR A SOLAR MODULE

(71) Applicant: MATRIX-MODULE GbR, Dortmund (DE)

(72) Inventors: Henning Busse, Leipzig (DE); Maximilian Scherff, Dortmund (DE)

(73) Assignee: MATRIX MODULE GMBH, Dortmund (DE)

(*) Notice: Subject to any disclaimer, the term of this patent is extended or adjusted under 35 U.S.C. 154(b) by 0 days.

(21) Appl. No.: 15/769,083

(22) PCT Filed: Oct. 18, 2016

(86) PCT No.: PCT/EP2016/074997
§ 371 (c)(1),
(2) Date: Apr. 18, 2018

(87) PCT Pub. No.: WO2017/067940
PCT Pub. Date: Apr. 27, 2017

(65) Prior Publication Data
US 2018/0309004 A1 Oct. 25, 2018

(30) Foreign Application Priority Data
Oct. 19, 2015 (DE) ..................... 10 2015 117 793.5

(51) Int. Cl.
*H01L 31/0475* (2014.01)
*H02S 40/42* (2014.01)
(Continued)

(52) U.S. Cl.
CPC ........ *H01L 31/0475* (2014.12); *H01L 31/049* (2014.12); *H02S 20/00* (2013.01);
(Continued)

(58) Field of Classification Search
CPC . H01L 31/0475; H01L 31/049; H01L 41/053; H01L 2924/171; H01L 23/3672;
(Continued)

(56) References Cited

U.S. PATENT DOCUMENTS 8,266,847 B2 9/2012 Edgar
8,302,363 B1* 11/2012 Johnson .................. E04H 6/025
52/655.1
(Continued)

FOREIGN PATENT DOCUMENTS

CN 201853724 U 6/2011
DE 3611543 A1 10/1987
(Continued)

OTHER PUBLICATIONS

International Search Report (and English translation) and Written Opinion of the International Search Authority for PCT/EP2016/074997 dated Feb. 15, 2017.

*Primary Examiner* — Michael Y Sun
(74) *Attorney, Agent, or Firm* — Melvin Li; Heslin Rothenberg Farley & Mesiti PC

(57) ABSTRACT

The invention relates to a rear face element for a solar module, said element being made of a material sheet that is shaped, in particular embossed and/or stamped. Some sections of the material sheet are arranged on a first plane, and some sections are arranged on at least one second plane parallel to the first plane. The material sheet forms spacer elements in a transition region between the first and the second plane in order to space the first plane from the second plane, and at least one first material sheet section extends from a first lateral edge to an opposing second lateral edge of the material sheet continuously, in particular in a linear manner. The invention also relates to a solar module and to a method for producing a solar module.

14 Claims, 2 Drawing Sheets

(51) Int. Cl.
*H02S 20/00* (2014.01)
*H01L 31/049* (2014.01)
*H02S 30/10* (2014.01)
*H01L 41/053* (2006.01)
*H01L 23/367* (2006.01)
*F21S 9/03* (2006.01)
*F24S 25/20* (2018.01)
*F24S 25/40* (2018.01)
*F24S 25/67* (2018.01)
*F24S 25/63* (2018.01)
*F24S 20/00* (2018.01)
*F24S 25/12* (2018.01)
*H02S 30/00* (2014.01)

(52) U.S. Cl.
CPC .............. *H02S 30/10* (2014.12); *H02S 40/42* (2014.12); *F21S 9/035* (2013.01); *F21S 9/037* (2013.01); *F24S 25/12* (2018.05); *F24S 25/20* (2018.05); *F24S 25/40* (2018.05); *F24S 25/63* (2018.05); *F24S 25/67* (2018.05); *F24S 2020/12* (2018.05); *H01L 23/3672* (2013.01); *H01L 23/3675* (2013.01); *H01L 41/053* (2013.01); *H01L 2924/171* (2013.01); *H02S 30/00* (2013.01); *Y02E 10/44* (2013.01); *Y02E 10/50* (2013.01)

(58) Field of Classification Search
CPC ..... H01L 23/3675; H02S 30/10; H02S 40/42; H02S 20/00; H02S 30/00; Y02E 10/50; Y02E 10/44; F24S 25/20; F24S 25/40; F24S 25/67; F24S 25/63; F24S 2020/12; F24S 25/12; F21S 9/035; F21S 9/037
See application file for complete search history.

(56) References Cited

U.S. PATENT DOCUMENTS

| | | | |
|---|---|---|---|
| 9,236,515 | B2 | 1/2016 | Brottier et al. |
| 2009/0120486 | A1* | 5/2009 | Buller ............. H01L 31/035281 |
| | | | 136/246 |
| 2009/0283136 | A1 | 11/2009 | Munch et al. |
| 2010/0031996 | A1* | 2/2010 | Basol ................. B32B 37/0053 |
| | | | 136/244 |
| 2010/0126554 | A1* | 5/2010 | Morgan ................ H01L 31/042 |
| | | | 136/246 |
| 2011/0056540 | A1* | 3/2011 | Edgar ..................... H02S 20/00 |
| | | | 136/251 |
| 2011/0240093 | A1* | 10/2011 | Tucker ..................... F24S 25/65 |
| | | | 136/245 |
| 2012/0298175 | A1 | 11/2012 | Van Roosemalen et al. |
| 2013/0174889 | A1 | 7/2013 | Dalland et al. |
| 2014/0196770 | A1* | 7/2014 | Jacobs, IV ............. H01L 31/18 |
| | | | 136/251 |
| 2015/0349703 | A1* | 12/2015 | Morad .................... H01L 31/05 |
| | | | 136/251 |
| 2017/0179321 | A1* | 6/2017 | Izardel .................... H02S 40/38 |

FOREIGN PATENT DOCUMENTS

| | | |
|---|---|---|
| DE | 212004000096 U1 | 8/2007 |
| DE | 202008013755 U1 | 3/2009 |
| DE | 202008013755 U1 | 4/2009 |
| DE | 102009020426 A1 | 11/2010 |
| DE | 102013220802 A1 | 4/2015 |
| FR | 2967817 A1 | 5/2012 |
| JP | 2000008567 A | 1/2000 |
| JP | 2001053321 A | 2/2001 |
| JP | WO2005029657 A1 | 11/2007 |
| KR | 101037207 B1 | 5/2011 |
| WO | 2005/119769 A1 | 12/2005 |
| WO | 2009/143577 A1 | 12/2009 |

* cited by examiner

REAR FACE ELEMENT FOR A SOLAR MODULE

CROSS REFERENCE TO RELATED APPLICATIONS

This application is a national stage filing under section 371 of International Application No. PCT/EP2016/074997, filed on Oct. 18, 2016, published in German on Apr. 27, 2017, as WO2017/067940 A1 and which claims priority to German Application No. 10 2015 117 793.5, filed on Oct. 19, 2015, the entire disclosure of these applications being hereby incorporated herein by reference.

The present invention relates to a rear face element for a solar module.

According to the prior art, it is known to construct solar modules in such a way that a plurality of possibly mechanically sensitive solar cells are electrically connected to one another and enclosed in a system of layers. The system of layers, which generally comprises a transparent substrate, in particular a glass substrate, and a rear face covering (backsheet), between which the solar cells are arranged, serves the purpose that the solar cells are protected from mechanical stresses and effects of weathering. At the same time, the electrical connectors of the solar cells to one another are also enclosed by the system of layers.

Usually, films of EVA (ethylene vinyl acetate) or some other suitable material are incorporated between the layers mentioned, so that the system of layers can be laminated together under the influence of heat and pressure.

A solar module at the same time comprises electrical terminals, with which the solar cells enclosed by the layers can be externally contacted. In this case, the solar cells are generally connected in series, in order to provide desired output voltages, and moreover a number of electrical terminals are usually provided, to allow separate circuits to be tapped separately. Separate tapping is necessary or advantageous for example when the solar modules are partially in the shade. There are therefore generally a multiplicity of electrical terminals, which must allow themselves to be externally contacted.

Solar modules according to the prior art in that case require a relatively high frame and a thick glass substrate (about 3.2 mm), in order to divert the forces acting from the surface area (snow, wind) initially into the frame and then to the clamping points in the substructure. At present, 30 mm to 40 mm are usual as the frame height.

For this, frame elements are pushed onto the module laminate on all four sides and connected to the module laminate with tape or silicone. Adjacent frame parts are connected to one another by a force fit at the corners of the frame, for example by being pressed in. The frame profile in this case reaches around the module laminate, so that a step about 1 mm high with respect to the glass surface is created.

The use of frame profiles in this case entails many disadvantages. The surrounding glass enclosure of the frame causes soiling of the glass and means that there are losses in yield as a result of local shading. This is accepted, or the cleaning cycles are adapted correspondingly. Furthermore, the high frame leads to a low packing density during shipment and consequently to higher costs. To reduce the frame height, elaborate simulations and tests are therefore performed, to be able to provide a minimal frame height with sufficient stability.

Diverting the area loads into the frame results in bending of the module about two axes, which leads to great mechanical stresses in the cells, particularly in the middle of the module. The module is only supported at four points. Moreover, during bending, the neutral phase is not ideal (beyond the plane of the cells) and varies its position over the surface of the module. This leads to a distribution of tensile and compressive stresses between the cells/cell connectors that is inhomogeneous over the surface area, which can result in a bending about two axes (spherical), which the solar cells cannot follow. This causes an increased risk of cell breakage.

To counteract this, thicker glass substrates and/or more stable frames are used, which in turn entail higher costs, greater weight, more difficult transport, etc. Assembly of the frames also involves considerable expenditure in terms of work, personnel and time and is not automated, or only partly, which significantly increases production expenditure.

What is more, the rear-side heat dissipation is unfavorable. The efficiency of the solar cells falls at higher temperatures, so good cooling has an efficiency-increasing effect. However, the closed frame profiles actually prevent convective flows. In particular when installed in or on a roof, at a small distance from the roof area, the heat dissipation in the case of solar modules with frame modules is therefore poor and efficiency is less than optimum.

It is also disadvantageous that fitting the modules requires special clamps, which have to be made to match the frame height, or are variable in height and consequently expensive. Therefore, fitting modules with clamps is comparatively laborious/expensive, not only with regard to the individual material required, and the associated storage costs, but additionally with respect to the fitting time required.

As an alternative, therefore, so-called fasteners with backrails and centerrails have been developed. In this case, backrails in the form of bars, box sections, U-shaped or double-T-shaped profiles or of a different design are fastened on the rear face of the module laminate.

This also entails many problems. The backrails are likewise only supported at a few points on the rear face of the module. As a result, the backrail must be made comparatively high. The high backrails lead to a low packing density during shipment and consequently to high transport costs, comparable to the known frame modules.

The backrail systems are also comparable to the frame modules in that during bending the neutral phase is not ideal (beyond the plane of the cells) and varies its position over the surface of the module. This leads to a distribution of tensile and compressive stresses between the cells/cell connectors that is inhomogeneous over the surface area, with a likewise increased risk of cell breakage. Rail mounting is performed exclusively after the lamination process, and thereby increases the production time and costs, since separate process steps are necessary.

Also with backrails, the rear-side heat dissipation is once again less than optimum. Convective flows are hindered by the rails (at least in one direction). In particular in the case of installation in or on a roof, with a small distance from the roof area, the heat dissipation is then poor. As already explained with reference to frame modules, good cooling is however important for the efficiency of the solar modules.

What is more, it is laborious to fasten the solar modules provided with backrails. Generally, two backrails are used on a solar module. These are for example arranged in the middle on the rear face of the laminate and are in particular fastened at the short projecting ends of the backrails, but fastening may also be performed at other points along the backrails. This has the disadvantage in particular that there are great bending distances, which necessitate greater dimensioning of the backrails.

It is consequently known from the prior art to provide solar modules either with a frame module or with backrails. In both variants, however, optimum cooling of the solar modules cannot be achieved, and fitting of the same is laborious. What is more, the technical situation requires either a very stable frame construction with a thick glass substrate or backrails with a great diameter, to be able to absorb the forces occurring. In both cases, however, there is a distribution of tensile and compressive stresses between the cells/cell connectors that is inhomogeneous over the surface area, which can result in cell breakages. What is more, transport is made more expensive by the altogether large diameter.

DE 102009020426 A1, DE 202008013755 U1 and FR 2967817 A1 disclose rear face elements for solar modules that have sections of the material sheet arranged at different distances from the solar cells. These rear face elements are produced exclusively by shaping or cutting into the material and in this case have in particular the disadvantage that disadvantageously poor cooling of the solar module is obtained. According to these embodiments known from the prior art, the air used for the cooling must flow through the complete length or width of the module. This results in a higher flow resistance, and consequently less exchange of air and, as it were, the temperature gradient between the solar module and the cooling air is reduced.

It is particularly disadvantageous with the known solutions that the rear face elements can even act as insulation, and consequently the solar cell temperature may be higher than in the case of a conventional module with a standard frame.

Since the conversion efficiency decreases with increasing temperature of the solar cell, this is a relevant effect that is particularly disadvantageous.

The present invention is therefore based on the object of overcoming the disadvantages of the prior art and in particular providing a device for absorbing the forces acting on the solar modules and for fastening the same that allows efficient production and fitting, good cooling and reduced transport costs of solar modules.

This object is achieved by a rear face element for a solar module formed from a material sheet that is shaped, cut into in some sections, in particular embossed and/or stamped, wherein some sections of the material sheet are arranged in a first plane and some sections are arranged in at least one second plane parallel to the first plane, and wherein the material sheet forms spacing elements in a transitional region from the first plane to the second plane in order to keep the first plane at a spacing distance from the second plane, and wherein at least one first material sheet section extends continuously, in particular in a linear manner, from a first lateral edge to an opposite second lateral edge of the material sheet in the first plane, wherein n first material sheet sections, where n=1, 2, 3, 4, 5, 6, 7, 8, 9 or more, extend from a first side edge to an opposite second side edge of the material sheet in the first plane and/or m second material sheet sections, where m=1, 2, 3, 4, 5, 6, 7, 8, 9 or more, extend from a third side edge of the material sheet to an opposite fourth side edge in the first plane, wherein the first and second material sheet sections extend in particular at right angles to one another, and wherein the material sheet sections produced from the material sheet by shaping and cutting-in form openings in the rear face element at least in some sections, in those regions in which they do not lie in the same plane.

Within the scope of the present invention, embossing and stamping should not be understood as meaning exclusively the conventional mechanical metalworking, but as it were all known separating processes, for example laser cutting or water-jet cutting, etching and the like.

The material sheet sections extending linearly should not, according to the invention, rule out in particular that, according to one embodiment, the material sheet sections are twisted within one another.

Within the scope of the present invention, parallel planes should not be understood as meaning exclusively two planes that are locally parallel over one another, but instead the distance between the first plane and the second plane may also vary locally. It is however preferred according to the invention that, on average, the surface areas are formed parallel over the area of the module.

The rear face element according to the invention may in this case be arranged on the rear face of a solar module. Therefore, according to one embodiment of the present invention, it may particularly advantageously be provided that no peripheral frame edge is formed in a way corresponding to the prior art, and the accompanying disadvantages are avoided; in particular, there is no critical point at which dirt can accumulate with the effect of shading the solar cells and adversely influencing the efficiency. It may, however, be provided that the material sheet optionally forms a kind of frame for the solar module at the edges by means of repeated bending over. Said frame according to the invention preferably has in this case the height of the rear face element, and so the disadvantages of the prior art can be avoided.

The rear face element according to the invention has in this case first and/or second material sheet sections extending longitudinally and transversely in relation to the plane of the solar module that extend in the first plane, which in the fitted state is kept at a further spacing distance from the solar module. The material sheet sections may extend linearly, but it is also conceivable for them to extend in any alternative way, for example in a curved and/or zigzagging manner, in order to form certain geometries such as for example a honeycomb pattern. The width of the material sheet sections may in this case vary along the material sheet sections. It can in this way be made possible that the stiffness of the material sheet sections can be adapted locally to the later loading.

The configuration according to the invention of the first plane means that, unlike in the case of framed modules, under loading (area loads such as wind, snow), the load is absorbed over the surface area. As a result, the structural height of the module and the diameter of the glass substrate can be made smaller.

Furthermore, the solar module can be supported on the material sheet not just at four points (as in the case of the framed module or in the case of modules with backrails), which act for example like longitudinal or transverse members, but along the longitudinal and transverse members. The bending of the module that results under area loading in this case only takes place orthogonally in relation to the support, that is to say in one direction and not as in the case of the framed module in two directions simultaneously. The mechanical stress on the cells is therefore very much less. This applies in particular whenever the neutral phase is brought into the plane of the cells by a clever combination of the thickness of the glass substrate with the configuration of the rear face element (height, material, material thickness, geometry of the material sheets).

When the solar modules are fastened on solar trackers, which have a central tube, there may be a base, for example at the center of the solar module, that additionally supports the module.

Since under loading the bending only occurs in one direction, it is even possible for greater bending to be accepted if the neutral phase is in the plane of the cells. In this case, the cell breakage rates are similarly low to in the case of a symmetrical glass/glass module, but with lower costs and better cooling.

Moreover, because the rear face element is configured in a way comparable to an extruded metal profile or in the form of an extruded metal profile, local loads (stresses of the substructure, wind, etc.) are absorbed very well within the rear face element. This property is determined by the precise shaping of the extrusion, and can consequently be adapted to the requirements.

Also, the second plane of the rear face element according to the invention acts as a heat conducting device, and consequently serves for cooling the solar modules. On the one hand, in this case the large surface of the entire material sheet is utilized for giving off the heat to the surroundings. On the other hand, there is a large supporting area of the second plane on the rear face of the solar modules, and so good dissipation of the heat can take place here.

Also, air can flow through the rear face element and contribute to further cooling. The large number of openings and struts between the two planes of the rear face element means that a turbulent flow, which dissipates the heat better, occurs between the two planes of the rear face element even at low flow rates.

This is made possible according to the invention by the cuts made in the material sheet from which the material sheet sections are formed. In this case, the cooling air can enter in the regions between two material sheet sections and leave from the region between the two planes, which induces a significantly better cooling effect than can be made possible by the rear face elements provided by the prior art. In the case of the rear face elements according to the prior art, the air must flow through the complete length or width of the module, which, as already stated, on the one hand causes a greater flow resistance, and consequently less exchange of air, and on the other hand reduces the temperature gradient between the module and the cooling air, it even being possible for this to have an insulating effect. Since the conversion efficiency decreases with increasing temperature of the solar cell, the solution according to the invention is therefore particularly advantageous.

A rear face element according to the invention consequently makes it possible to use just one component, which can be easily, quickly and securely connected to a solar module. In this case, the rear face element may even be applied during the lamination process. The first plane, facing away from the solar module, absorbs the tensile and compressive forces (during bending of the module), the second plane offers a large supporting area for heat dissipation.

What is more, the better absorption of the forces occurring allows the thickness of the solar module to be reduced, both with regard to the layers of the module, in particular the glass substrate, and with regard to the not required frame elements and backrails. This reduces the costs further and optimizes possibilities for transport.

The rear face element according to the invention is consequently capable of absorbing forces acting on solar modules and for fastening the same, allows efficient production and fitting, good cooling and reduced transport costs of solar modules.

In this case, it may be provided in particular that the first material sheet sections are arranged parallel to one another and/or the second material sheet sections are arranged parallel to one another.

It may also be provided that the n first material sheet sections extend continuously, from a first side edge to an opposite second side edge of the material sheet, in the first plane and/or the m second materials sheet sections extend continuously from a third side edge of the material sheet to an opposite fourth side edge in the first plane.

It goes without saying that other variants for the arrangement are also conceivable and the material sheet sections themselves may extend linearly or in the form of a curve or in any desired geometry. It may also be provided that the second plane p, where p=1, 2, 3, 4, 5, 6, 7, 8, 9 or more, comprises sheet-like elements which are arranged at a spacing distance from one another, and which in particular are arranged in each case between the n first material sheet sections and/or m second material sheet sections of the first plane.

The arrangement of first and second material sheet sections extending at right angles to one another makes it possible to define regions which, by means of shaping, are arranged in the second plane. This may be advantageous according to one embodiment of the present invention.

According to one embodiment of the invention, it may be preferred that each of the sheet-like elements of the second plane is connected to the first and/or second material sheet sections of the first plane by means of one spacing element, in particular four spacing elements, the spacing elements being formed by cutting in and shaping the material sheet.

For the purposes of the present invention, cutting-in should be understood broadly, and refer to the partial or complete severing of a material sheet section or a material sheet. In this respect, a large number of separating processes are known in the prior art.

The rear face element according to the invention is formed from a single material sheet, and so the spacing elements form the transition between the first plane and the second plane. The spacing elements are in particular designed and set up for allowing a force transmission from the first plane into the second plane. It may also be provided that the rear face element has q cells, where q=1, 2, 3, 4, 5, 6, 7, 8, 9 or more, wherein each of the q cells is formed from two first material sheet sections, two second material sheet sections in the first plane and a sheet-like element in the second plane.

It is in this case preferred that a first first material sheet section forms a first side end, a second first material sheet section forms a second side end, opposite from the first side end, a first second material sheet section forms a third side end, arranged at right angles to the first and second side ends, and a second second material sheet section forms a fourth side end, opposite from the third side end, wherein, by shaping, a first cutout of the material sheet, beginning with the second second material sheet section, extends at a first distance parallel to the first first material sheet section up to a first spacing distance from the first second material sheet section and a second cutout of the material sheet, beginning with the second second material sheet section, extends at a second distance, greater than the first distance, parallel to the first first material sheet section up to a second spacing distance, greater than the first spacing distance, from the first second material sheet section and/or, by shaping, a third cutout of the material sheet, beginning with the first second material sheet section, extends at a first distance parallel to the second first material sheet section up to a first spacing distance from the second second material sheet section and a fourth cutout of the material sheet, beginning with the first second material sheet section, extends at a second distance, greater than the first distance, parallel to the second first material sheet section up to a second spacing distance, greater than the first spacing distance, from the second second material sheet section and/or, by shaping, a fifth cutout of the material sheet, beginning with the first first material sheet section, extends at a first distance parallel to the first second material sheet section up to a first spacing distance from the second first material sheet section and a sixth cutout of the material sheet, beginning with the first first material sheet section, extends at a second distance, greater than the first distance, parallel to the first second material sheet section up to a second spacing distance, greater than the first spacing distance, from the second first material sheet section and/or, by shaping, a seventh cutout of the material sheet, beginning with the second first material sheet section, extends at a first distance parallel to the second second material sheet section, up to a first spacing distance from the first first material sheet section and an eighth cutout of the material sheet, beginning with the second first material sheet section, extends at a second distance, greater than the first distance, parallel to the second second material sheet section up to a second spacing distance, greater than the first spacing distance, from the first first material sheet section, and so at least one spacing element, in particular four spacing elements, is/are formed for keeping the sheet-like element at a spacing distance from the first and second material sheet sections within the cell.

By this arrangement in the material sheet, it can be made possible that, by cutting-in and shaping, a large number of sheet-like elements are transferred from the first plane into the second plane, arranged there in particular parallel to the first plane, and as it were third material sheet sections form the transition from the first plane to the second plane. These third material sheet sections in this case also provide the spacing elements. Furthermore, it may be provided that the material sheet consists of and/or comprises metal, high-grade steel, steel sheet, iron sheet, copper, brass, aluminum, plastic, injection-molded plastic and/or partially encapsulated metal, and in particular has a thickness in a range from 0.2 mm to 4 mm, preferably in a range from 0.4 mm to 2 mm, particularly preferably in a range from 0.5 mm to 1 mm.

It may also be advantageous that the rear face element has at least one clearance in the first plane and/or in the second plane, in order to receive a connection socket for electrical contact of a solar cell and/or a solar cell matrix and/or to allow electrical contact of a solar cell and/or a solar cell matrix, in particular the region exposed in the clearance of the cross-connectors of a solar cell and/or a solar cell matrix.

The solar module at the same time comprises electrical terminals, with which the solar cells enclosed by the layers can be externally contacted. In this case, the solar cells are generally connected in series, in order to provide desired output voltages, and moreover a number of electrical terminals are usually provided, to allow separate circuits to be tapped separately. Metal strips, for example copper strips, with or without an additional metal or alloy coating are used inter alia as cell connectors and cross-connectors. Such a metal strip is provided as a separate cross-connector for each connection between two strings of solar cells that are to be electrically connected. The cell connectors themselves are then soldered to the cross-connector. For example, before the lamination of the solar module, terminal lugs may be led out from the EVA backsheet for creating the electrical terminals. After the lamination, terminal elements such as sockets or plugs could then be connected, for example by soldering, to these terminal lugs led to the outside. For this, for example, a connection socket is adhesively attached on the rear face of the laminate by means of silicone and then the terminal lugs of the solar cells are electrically connected to the contacts of the connection socket. After electrical contacting has been performed, the connection socket itself may be filled with material for sealing the same, in particular a radiation-curing material, and/or optionally a sealing cover may be fitted over the connection socket.

If the rear face element according to the invention already has clearances for the electrical contacting and the connection sockets, this is possible by simple means and with minimal effort.

If the rear face element according to the invention only has openings for the cross-connectors, the region between the connection socket and the rear face of the layer laminate is covered with the thermally conductive material of the material sheet and can in this way serve for better heat dissipation of the waste heat of the diodes that are contacted by the cross-connectors. It may also be provided that the material sheet comprises reinforcing elements, in particular arranged in the connecting region of the rear face element of the solar module to the substructure. This serves for stiffening the rear face element and increases its stability.

It may also be provided according to the invention that the second plane, in particular at least one sheet-like element of the second plane, is shaped in such a way that a third plane is formed and/or has a shaped, in particular embossed, surface structure, in particular is honeycomb-shaped.

Such a third plane and/or structure of the second plane may serve for example for further optimized cooling and not for improving the mechanical stiffness.

It may also be provided that the edges of the material sheets are edged in the direction of the plane of the cells. As a result, injuries from cuts are avoided.

It may also be provided that retaining eyelets, clamps, cable guides and/or cable ducts for the electrical contacting of the solar module are comprised and/or the rear face element has clearances in the edge region in order to allow secure transport of electrical contact elements, in particular cables and/or plugs.

This configuration makes it possible to dispense with further fitting material (cable ties, etc.).

It may also be provided that at least one outer edge, in particular two opposite outer edges, preferably all the edges, of the rear face element is or are shaped by flanging and in particular form a profile suitable for stiffening, in particular a box profile.

Such flanging serves for the further stiffening of the rear face element.

According to one embodiment, it may also be provided that at least one outer edge, in particular two opposite outer edges, preferably all the edges, of the rear face element comprises or comprise clearances and/or formations that can be brought into or are in operative connection with comparable clearances and/or formations of a further rear face element, the clearances and/or formations being designed and set up for aligning two rear face elements with one another.

This makes it possible for a number of rear face elements to be easily connected to one another, without laborious exact manual alignment and with no need for re-measuring. The fitting time can consequently be reduced significantly.

It may also be provided that at least one outer edge, in particular two opposite edges, preferably all the edges, of the rear face element have fastening devices and/or clearances, in particular in the form of bores, designed and set up for connecting the rear face elements unreleasably or releasably to a further element and/or the substructure. By such a configuration of the rear face element it is possible, depending on the substructure, to fasten the rear face element just with screws, without any further material (clamps).

Finally, it may be provided that the rear face element consists of a shaped material sheet.

The invention also provides a solar module, comprising at least two solar cells and at least one rear face element according to the invention arranged on the rear face of the solar cells, the second plane of the at least one rear face element being arranged facing the rear face of the solar cells.

In this case, one or more rear face elements may be positioned in sheets of the same length or different lengths on the rear face of the laminar structure in such a way that not the complete backsheet but only the relevant regions to be supported are acted upon by it. It is for example possible to provide specific forms of the rear face element according to the invention for a tracker system or for a special push-in system. In this way, optimum adaptation of the mechanical stability to the prevailing installation situation can take place with minimal use of material. It has however proven to be advantageous in this case if the main direction of tension and compression of the system of layers is completely covered over by the rear face element in order to be able to absorb optimally the forces occurring.

In this case, it is provided in particular that the solar module does not comprise a module frame or a fitting system comprising backrails.

It may also be provided that in each case at least one sheet-like element and/or at least one cell, in particular r sheet-like elements and/or cells, where r=1, 2, 3, 4, 5, 6, 7, 8, 9 or more, preferably where r=1, 4, 9 or 16, is arranged in the second plane of the rear face element at least partially overlapping, in particular congruent, with in each case at least one of the solar cells of the solar cell matrix of the solar module, and so r sheet-like elements and/or cells lie opposite the rear face of each of the solar cells.

Finally, it may be provided that the rear face element covers over the entire rear face of the solar module or at least one or more rear face elements cover(s) a partial region of the rear face of the solar module. The invention also provides a method for producing a solar module comprising the following steps, in particular in this sequence:
a) providing a substrate panel;
b) arranging at least two solar cells that are electrically contacted with respect to one another on the substrate panel;
c) arranging at least one rear-side laminate layer on the rear face of the solar cell;
d) arranging at least one rear face element according to the invention on the rear-side laminate layer; and
e) laminating the solar module.

It may in this case be provided that the method also comprises the following steps after step e), in particular in this sequence:
f) trimming the laminate; and
g) placing the connection sockets for the electrical contacting of the solar module.

The invention also provides an alternative method for producing a solar module comprising the following steps, in particular in this sequence:
aa) providing a substrate panel;
ab) arranging at least two solar cells that are electrically contacted with respect to one another on the substrate panel;
ac) arranging at least one rear-side laminate layer on the rear face of the solar cell;
ad) laminating at least the rear-side laminate layer;
ae) optionally trimming the laminate;
af) optionally placing the connection sockets for the electrical contacting of the solar module and arranging at least one rear face element according to the invention on the rear-side laminate layer and connecting the rear face element to the rear-side laminate layer, in particular by silicone or polyurethane adhesive; or
ag) arranging at least one rear face element according to the invention on the rear-side laminate layer and connecting the rear face element to the rear-side laminate layer, in particular by silicone or polyurethane adhesive, and placing the connection sockets for the electrical contacting of the solar module.

The methods according to the invention allow a quicker, easier and less costly process for producing solar modules.

According to the conventional production methods, generally first an EVA layer is arranged on a glass substrate, in order to form a substrate panel, on which in turn the solar cells are arranged. Another EVA layer and the backsheet, that is to say the rear-side laminate layer, are applied to the rear face of the solar cells, followed by lamination of the module. After the lamination, the laminate is trimmed and the connection sockets for the electrical contacting are placed.

Only after this step are the frame elements connected to the laminar structure, in that they are siliconized and fitted on. At the same time, the corner angle pieces of the frame are pressed into the frame elements.

According to the first method according to the invention, the rear face element according to the invention is already connected to the rear face of the module during module construction, in particular is adhesively bonded over the surface areas at the contact regions. This is important for heat dissipation. The latter may be performed during the laminating process (laminator, autoclave). In this way, a series of working steps and machines can be saved in comparison with the classic module.

Alternatively, such adhesive bonding of the rear face element may also only be performed after a lamination of the module. Also in this case, a considerable number of working steps are saved, since only one connecting step is necessary.

Further features and advantages of the invention emerge from the following description, in which exemplary embodiments of the invention are explained by way of example on the basis of schematic drawings, without thereby restricting the invention. In the drawings:

FIG. 1: shows a schematic perspective view of a rear face element according to the invention;

FIG. 2: shows a schematic perspective view of a second embodiment of a rear face element according to the invention;

FIG. 3: shows a schematic perspective view of an embodiment of a further rear face element according to the invention and of a solar module; and FIG. 4: shows a schematic side view of an embodiment of the rear face element according to the invention and of the solar module according to FIG. 3.

In FIG. 1, a first embodiment of a rear face element 1 according to the invention is represented. The rear face element 1 consists of a shaped material sheet 3, wherein some sections of the material sheet 3 are arranged in a first plane 5 and some sections are arranged in a second plane 7 parallel to the first plane 5. In a transitional region from the first plane 5 to the second plane 7, the material sheet 3 forms spacing elements 9 in order to keep the first plane 3 at a spacing distance from the second plane 5. Two first material sheet sections 11, 11' extend in this case parallel to one another and at right angles to two second material sheet sections 13, 13' arranged parallel to one another.

In this case, the first first material sheet section 11 has a first side end 15 and the second first material sheet section 11' has a second side end (not shown), opposite from the first side end 15. The first second material sheet section 13 has a third side end, arranged at right angles to the first and second side ends 15, and the second second material sheet section 13' has a fourth side end 17', opposite from the third side end 17. It goes without saying that this configuration should only be understood as given by way of example. The side ends 17, 17' may alternatively also be curved, and so the spacing elements 9 are not rectangularly formed. The pointed corners of the first and second planes 5, 7 may of course also be formed as rounded.

By shaping, a first cutout of the material sheet 3, beginning with the second second material sheet section 13', extends at a first distance 21 parallel to the first first material sheet section 11 up to a first spacing distance 19 from the first second material sheet section 13 and a second cutout of the material sheet 3, beginning with the second second material sheet section 13', extends at a second distance 21', greater than the first distance 21, parallel to the first first material sheet section 11 up to a second spacing distance 19', greater than the first spacing distance 19, from the first second material sheet section 13.

There are corresponding cutouts turned in each case by 90°, in order to keep the second plane 7 at a spacing distance from the first plane 5 and in order to transmit the forces acting on the second plane 7 to the first plane 5. FIG. 2 shows a further embodiment of a rear face element 1' according to the invention. This comprises 9 cells 23 according to the exemplary embodiment in FIG. 1.

It can be seen well in FIG. 1 and the further figures that an optimum circulation of air can be made possible by the openings formed in the material sheet, represented by way of example by the arrows A.

It goes without saying that here, too, the number of cells 23 should only be understood as given by way of example and they can be formed in any desired number, symmetrically or asymmetrically. All nine cutouts have in FIG. 2 the same direction of rotation. The direction of rotation may however also be different.

Figure 1:
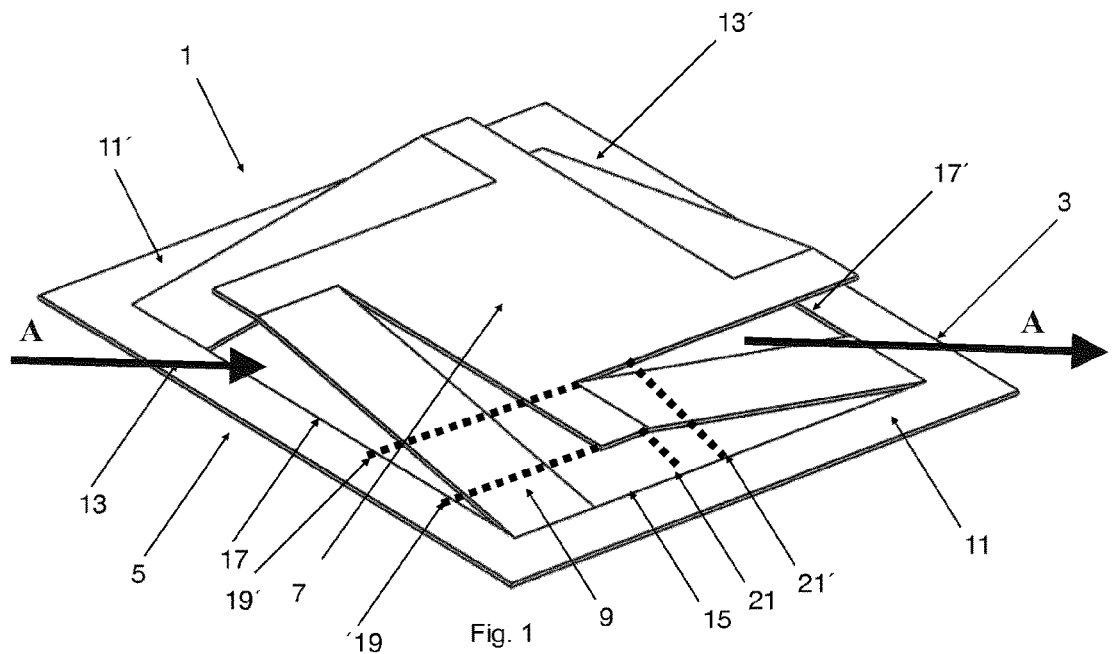
Figure 2:
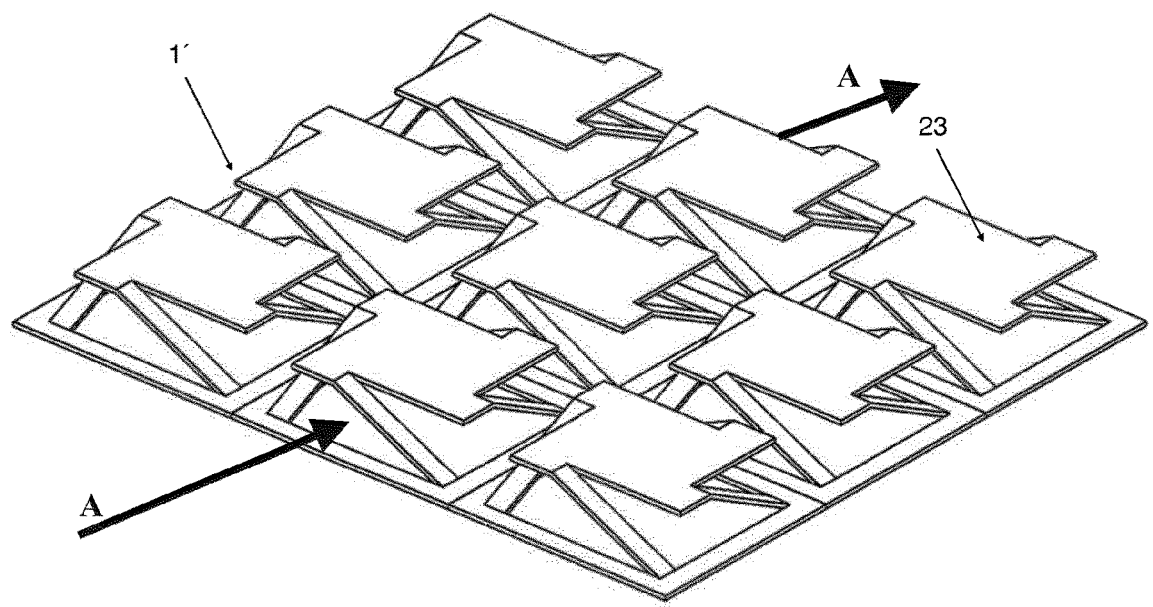
Figure 3:
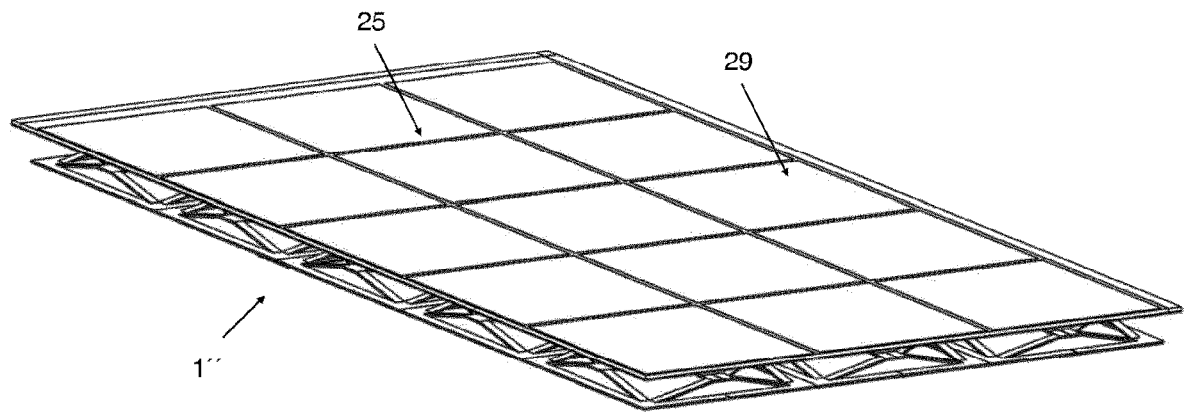
FIG. 3 shows a solar module 25 according to the invention, which is connected to an alternative rear face element 1", in a perspective view.
Figure 4:
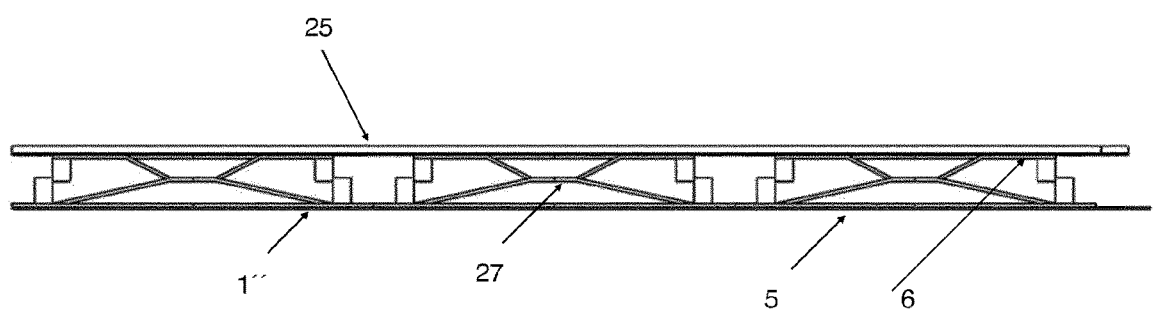
FIG. 4 shows the solar module 25 in a schematic sectional view.

In this case, the configurational variant of the rear face element 1" according to the invention differs by a third plane 27, which is arranged between the first plane 5 and the second plane 7. As already stated above, the geometry and the number of the planes formed by the material sheet 3 can be adapted to the specific application, in order to stabilize and fasten the laminar structure 29 comprising the solar cells.

The features of the invention that are disclosed in the foregoing description, the claims and the drawings may be essential both individually and in any desired combination for implementing the invention in various embodiments.

The invention claimed is:

1. A rear face element of a solar module formed from one single material sheet that is shaped, cut into in some sections, thus forming material sections, wherein some material sections of the material sheet are arranged in a first plane and some sections are arranged in at least one second plane parallel to the first plane, and wherein the material sheet forms spacing elements in a transitional region from the first plane to the second plane in order to keep the first plane at a spacing distance from the second plane, and wherein at least one first material sheet section extends continuously, from a first lateral edge to an opposite second lateral edge of the material sheet in the first plane, wherein n first material sheet sections, where n=1, 2, 3, 4, 5, 6, 7, 8, 9 or more, extend from a first side edge to an opposite second side edge of the material sheet in the first plane and/or m second material sheet sections, where m=1, 2, 3, 4, 5, 6, 7, 8, 9 or more, extend from a third side edge of the material sheet to an opposite fourth side edge in the first plane, wherein the first and second material sheet sections extend at angles to one another, and wherein the at least one first material sheet section, the second material sheet sections, the spacing elements, and material sheet sections in the second plane have a shape with openings in the rear face element.

2. The rear face element as claimed in claim 1, characterized in that the n first material sheet sections extend continuously, from a first side edge to an opposite second side edge of the material sheet, in the first plane and/or the m second material sheet sections extend continuously from a third side edge of the material sheet to an opposite forth side edge in the first plane.

3. The rear face element as claimed in claim 1, characterized in that the second plane p, where p=1, 2, 3, 4, 5, 6, 7, 8, 9 or more, comprises sheet-like elements which are arranged at a spacing distance from one another, and are arranged in each case between the n first material sheet sections and/or m second material sheet sections of the first plane.

4. The rear face element as claimed in claim 3, characterized in that each of the sheet-like elements of the second plane is connected to the first and/or second material sheet sections of the first plane by four spacing elements, the spacing elements being part of the material sheet.

5. The rear face element as claimed in claim 3, characterized in that the rear face element has q cells, where q=1, 2, 3, 4, 5, 6, 7, 8, 9 or more, wherein each of the q cells is formed from two first material sheet sections, two second material sheet sections in the first plane and a sheet-like element in the second plane.

6. The rear face element as claimed in claim 1, characterized in that the material sheet consists of and/or comprises metal, high-grade steel, steel sheet, iron sheet, copper, brass, aluminum, plastic, injection-molded plastic and/or partially encapsulated metal, and has a thickness in a range from 0.2 mm to 4 mm.

7. The rear face element as claimed in claim 1, characterized in that the rear face element has at least one clearance in the first plane and/or in the second plane, in order to receive a connection socket for electrical contact of a solar cell and/or a solar cell matrix and/or to allow electrical contact of a solar cell and/or a solar cell matrix wherein the region is exposed in the clearance of the cross-connectors of a solar cell and/or a solar cell matrix.

8. The rear face element as claimed in claim 1, characterized in that the material sheet comprises reinforcing elements arranged in a connecting region of the rear face element of the solar module to a substructure.

9. The rear face element as claimed in claim 3, characterized in that at least one sheet-like element of the second plane is shaped in such a way that a third plane is formed and/or has a shaped, or embossed, surface structure.

10. The rear face element as claimed in claim 1, characterized in that retaining eyelets, clamps, cable guides and/or cable ducts for the electrical contacting of the solar module are comprised and/or the rear face element has clearances in the edge region in order to allow secure transport of electrical contact elements, and to simplify/ensure fastening thereof after fitting of the solar module.

11. The rear face element as claimed in claim 1, characterized in that all the edges of the rear face elements have the shape of a flange.

12. The rear face element as claimed in claim 1, characterized in that all the edges of the rear face element comprise clearances and/or formations that can be brought into or are in operative connection with comparable clearances and/or formations of a further rear face element, the clearances and/or formations being designed and set up for aligning two rear face elements with one another.

13. The rear face element as claimed in claim 1, characterized in that all the edges of the rear face element have fastening devices and/or clearances.

14. The rear face element as claimed in claim 1, characterized in that the rear face element consists of a shaped material sheet.

\* \* \* \* \*